United States Patent
Zhang et al.

(10) Patent No.: US 11,075,301 B2
(45) Date of Patent: Jul. 27, 2021

(54) NANOSHEET WITH BURIED GATE CONTACT

(71) Applicant: INTERNATIONAL BUSINESS MACHINES CORPORATION, Armonk, NY (US)

(72) Inventors: Jingyun Zhang, Albany, NY (US); Choonghyun Lee, Rensselaer, NY (US); Takashi Ando, Eastchester, NY (US); Alexander Reznicek, Troy, NY (US); Pouya Hashemi, Purchase, NY (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 16/728,462

(22) Filed: Dec. 27, 2019

(65) Prior Publication Data
US 2021/0202749 A1 Jul. 1, 2021

(51) Int. Cl.
*H01L 21/336* (2006.01)
*H01L 29/423* (2006.01)
*H01L 29/66* (2006.01)
*H01L 21/768* (2006.01)
*H01L 29/06* (2006.01)
*H01L 21/311* (2006.01)
*H01L 29/786* (2006.01)
(Continued)

(52) U.S. Cl.
CPC .. *H01L 29/78606* (2013.01); *H01L 21/02532* (2013.01); *H01L 21/02603* (2013.01); *H01L 21/28512* (2013.01); *H01L 29/0673* (2013.01); *H01L 29/42392* (2013.01); *H01L 29/66742* (2013.01); *H01L 29/78696* (2013.01)

(58) Field of Classification Search
CPC ......... H01L 21/02532; H01L 21/02603; H01L 21/28512; H01L 21/823437; H01L 21/82345; H01L 21/823842; H01L 29/0673; H01L 29/42392; H01L 29/66742; H01L 29/78606; H01L 29/78696
See application file for complete search history.

(56) References Cited

U.S. PATENT DOCUMENTS

| | | | |
|---|---|---|---|
| 8,614,509 | B2 | 12/2013 | Kim |
| 9,812,449 | B2 | 11/2017 | Obradovic |
| 9,972,720 | B2 | 5/2018 | Bae |

(Continued)

FOREIGN PATENT DOCUMENTS

WO      0199197 A1    12/2001

OTHER PUBLICATIONS

Kunz et al., "Reduction of Parasitic Capacitance in Vertical MOSFETs by Spacer Local Oxidations", IEEE Transactions on Electron Devices, vol. 50, No. 6, Jun. 2003, p. 1487-1493.

*Primary Examiner* — David C Spalla
(74) *Attorney, Agent, or Firm* — L. Jeffrey Kelly

(57) ABSTRACT

A semiconductor structure including a nanosheet stack on a silicon germanium on insulator substrate, the nanosheet stack including alternating layers of a sacrificial semiconductor material and a semiconductor channel material vertically aligned and stacked one on top of another, a gate conductor orthogonal to the nanosheet stack and wrapping around the semiconductor channel material layers of the nanosheet stack, and a gate contact on the gate conductor layer adjacent to the nanosheet stack.

19 Claims, 18 Drawing Sheets

Section A-A

(51) Int. Cl.
    *H01L 21/02*     (2006.01)
    *H01L 21/285*     (2006.01)

(56) References Cited

U.S. PATENT DOCUMENTS

| | | |
|---|---|---|
| 10,103,238 B1 * | 10/2018 | Zang .................... H01L 29/1079 |
| 2005/0236667 A1 | 10/2005 | Goto |
| 2017/0110595 A1 * | 4/2017 | Sengupta .......... H01L 29/66545 |
| 2017/0170268 A1 | 6/2017 | Song |
| 2019/0187092 A1 * | 6/2019 | Cheng ................ H01L 21/02603 |
| 2020/0006477 A1 * | 1/2020 | Cheng ................. H01L 29/0653 |
| 2020/0312981 A1 * | 10/2020 | Bomberger ......... H01L 29/7853 |
| 2021/0020644 A1 * | 1/2021 | Paul ...................... H01L 27/092 |

* cited by examiner

Section A-A

Section B-B

Section A-A

Section B-B

Section A-A

Section B-B

Section A-A

Section B-B

Section A-A

Section B-B

Section A-A

Section B-B

Section A-A

Section B-B

Section A-A

Section B-B

NANOSHEET WITH BURIED GATE CONTACT

BACKGROUND

The present invention relates, generally, to the field of semiconductor manufacturing, and more particularly to fabricating field effect transistors.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. As demands to reduce the dimensions of transistor devices continue, nanosheet FETs help achieve a reduced FET device footprint while maintaining FET device performance. A nanosheet FET includes a plurality of stacked nanosheets extending between a pair of source drain epitaxial regions. A gate all around nanosheet refers to a gate which surrounds all vertical surfaces of the nanosheet FET. A nanosheet device contains one or more layers of semiconductor channel material portions having a vertical thickness that is substantially less than its width.

Gate all around structures, such as nanosheet devices, can help improve electrostatic control which is required for further aggressive device scaling. With more aggressive performance targets, improvements are needed, such as contacted gate poly pitch ("CPP") scaling, reductions of parasitic capacitance, and prevention of shorting contacts as the distance between them shrinks with more aggressive scaling. An improvement for gate formation to help prevent shorting between a gate and a source drain region while also lowering parasitic capacitance would be beneficial for gate all around structures.

SUMMARY

According to an embodiment, a method for forming a semiconductor structure is provided. The method including forming a nanosheet stack on a silicon germanium on insulator substrate, the nanosheet stack comprising alternating layers of a sacrificial semiconductor material and a semiconductor channel material vertically aligned and stacked one on top of another, removing the silicon germanium layer of the silicon germanium on insulator substrate to create a void directly beneath the nanosheet stack, forming a gate conductor layer within the void directly beneath the nanosheet stack, wherein the gate conductor separates the nanosheet stack from an insulating layer of the silicon germanium on insulator substrate, and forming a gate contact on the gate conductor layer adjacent to the nanosheet stack.

According to an embodiment, a method for forming a semiconductor structure is provided. The method including forming a nanosheet stack on a silicon germanium on insulator substrate, the nanosheet stack comprising alternating layers of a sacrificial semiconductor material and a semiconductor channel material vertically aligned and stacked one on top of another, forming a first gate conductor layer orthogonal to the nanosheet stack, the gate conductor wraps around the semiconductor channel material layers of the nanosheet stack, patterning the first gate conductor to expose end portions of the silicon germanium layer of the silicon germanium on insulator substrate, removing the silicon germanium layer of the silicon germanium on insulator substrate to create a void directly beneath the nanosheet stack, forming a second gate conductor layer on top of the first gate conductor layer and within the void directly beneath the nanosheet stack, and forming a gate contact on the second gate conductor layer adjacent to the nanosheet stack.

According to an embodiment, a semiconductor structure is provided. The semiconductor structure including a nanosheet stack on a silicon germanium on insulator substrate, the nanosheet stack including alternating layers of a sacrificial semiconductor material and a semiconductor channel material vertically aligned and stacked one on top of another, a gate conductor orthogonal to the nanosheet stack and wrapping around the semiconductor channel material layers of the nanosheet stack, and a gate contact on the gate conductor layer adjacent to the nanosheet stack.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

Figure 1:
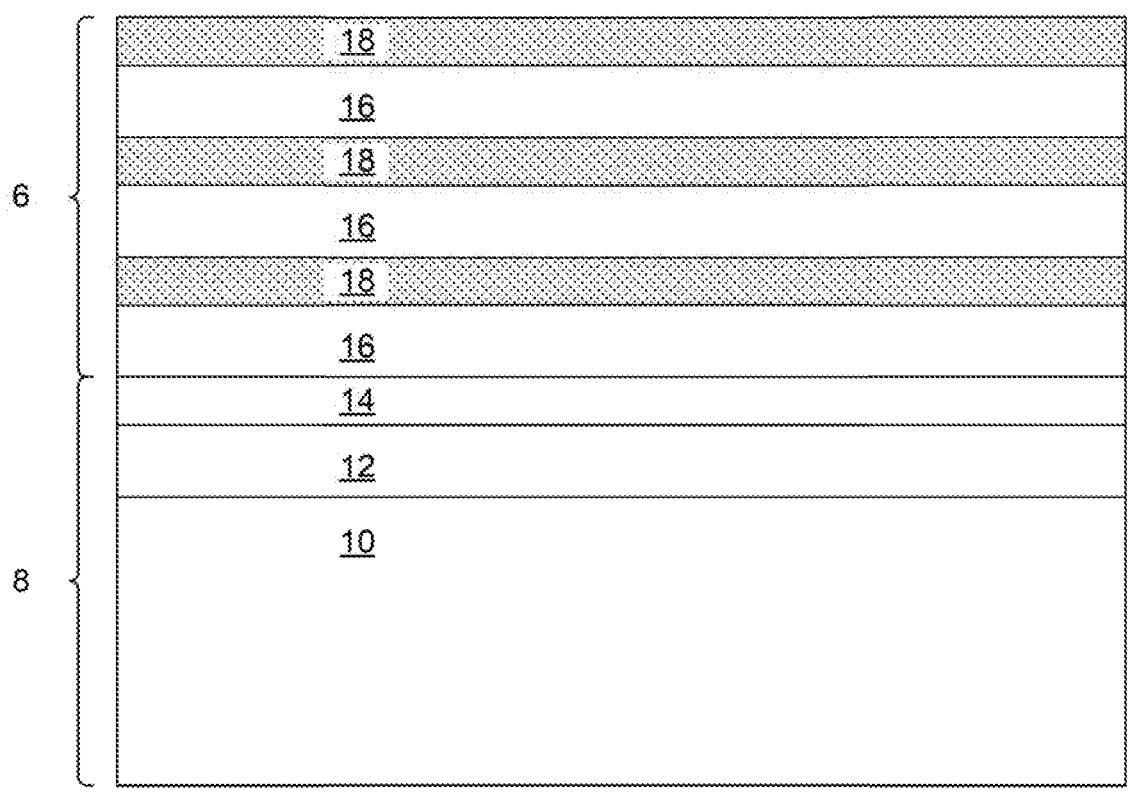
FIG. 1 illustrates a cross-sectional view of a semiconductor structure at an intermediate stage of fabrication, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A nanosheet FET may be formed from of stacked nanosheets, with alternate layers of silicon and silicon germanium, which are then formed into nanosheet stacks. A gate all around structure may be formed on all vertical sides and on a horizontal top surface of a section of the nanosheet stack. As dimensions of the nanosheet FET continue to be reduced, a distance between a source drain contact and a gate contact is reduced, thereby increasing the chances of a short occurring between the source drain and the gate. Additionally, the close proximity can cause increased parasitic capacitance between the source drain contact and the gate contact.

The present invention generally relates to semiconductor manufacturing and more particularly to forming a buried gate contact for a nanosheet transistor. The buried gate contact provides more space between a source drain contacts and a gate contact, thereby reducing a likelihood of a short. The buried gate contact further reduces parasitic capacitance, and improves device performance. In particular, embodiments of the present invention use an additional sacrificial silicon germanium layer in fabricating the buried gate contact at a bottom of a nanosheet stack. A method of forming the buried gate contact at a bottom of the nanosheet transistor is described in detail below by referring to the accompanying drawings in FIGS. 1-18, in accordance with an illustrative embodiment.

Referring now to FIG. 1, a semiconductor structure 100 (hereinafter "structure") at an intermediate stage of fabrication is shown according to an exemplary embodiment. FIG. 1 is a cross-sectional view of the structure 100. The structure 100 of FIG. 1 may be formed or provided.

The structure 100 may include a stack of alternating semiconductor layers 6 on a substrate 8. The substrate 8 may be, for example, a layered semiconductor such as a SiGe-on-insulator, where a buried insulator layer, for example the insulator layer 12, separates a base substrate, for example the base substrate 10, from a top semiconductor layer, for example a SiGe layer 14. In an embodiment, the SiGe layer 14 is a silicon germanium layer having a relatively low concentration of germanium, such as, for example, a germanium concentration of 20 atomic percent or less. The SiGe layer 14 may have a thickness ranging from about 1 nm to about 50 nm, more preferably ranging from about 10 nm to about 40 nm, and most preferably ranging from about 20 nm to about 30 nm. Components of the structure 100 may be subsequently formed in or from the top semiconductor layer of the SOI silicon on insulator or SGOI (silicon-germanium on insulator) substrate.

In other embodiments, the substrate 8 may be a bulk substrate, which may be made from any of several known semiconductor materials such as, for example, silicon, germanium, silicon-germanium alloy, carbon-doped silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 8 may be approximately, but is not limited to, several hundred microns thick.

The stack of alternating semiconductor layers 6 (hereinafter "semiconductor stack") is formed upon substrate 8. The semiconductor stack 6 includes vertically aligned alternating layers of sacrificial semiconductor material layer 16 and semiconductor channel material layer 18. The semiconductor stack 6 is sequentially formed upon substrate 8. As mentioned above, the semiconductor stack 6 includes the sacrificial semiconductor material layers 16 and the semiconductor channel material layers 18, which alternate one atop the other. In FIG. 1, and only by way of an example, the semiconductor stack 6 includes three layers of sacrificial semiconductor material layer 16 and three layers of semiconductor channel material layer 18. The material stacks that can be employed in embodiments of the present invention are not limited to the specific embodiment illustrated in FIG. 1. Instead, the semiconductor stack 6 can include any number of sacrificial semiconductor material layers 16 and semiconductor channel material layers 18. The semiconductor stack 6 is used to provide a gate-all-around device that includes vertically stacked semiconductor channel material nanosheets for a p-channel field-effect transistor (pFET) or n-channel field-effect transistor (nFET) device.

Each sacrificial semiconductor material layer 16 is composed of a first semiconductor material which differs in composition from at least an upper portion of substrate 8. In an embodiment, the upper layer of the substrate 8 is composed of silicon germanium (i.e. the SiGe layer 14), and each sacrificial semiconductor material layer 16 is also composed of silicon germanium, but with a different germanium concentration. For example, in such an embodiment, each sacrificial semiconductor material layer 16 may have a germanium concentration less than 50 atomic percent. In another example, each sacrificial semiconductor material layer 16 may have a germanium concentration ranging from about 20 atomic percent to about 40 atomic percent. Each sacrificial semiconductor material layer 16 can be formed using a deposition technique or an epitaxial growth technique.

Each semiconductor channel material layer 18 is composed of a second semiconductor material that has a different etch rate than the first semiconductor material of sacrificial semiconductor material layers 16. The second semiconductor material can be, for example, silicon. The second semiconductor material, for each semiconductor channel material layer 18, can be formed utilizing an epitaxial growth or deposition technique.

The semiconductor stack 6 (16, 18) can be formed by sequential epitaxial growth of alternating layers of the first semiconductor material and the second semiconductor material.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition technique, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth techniques include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from approximately 550° C. to approximately 900° C. Although higher temperature typically results in faster deposition, the faster deposition may result in crystal defects and film cracking. The epitaxial growth the first and second semiconductor materials that provide the sacrificial semiconductor material layers and the semiconductor channel material layers, respectively, can be performed utilizing any well-known precursor gas or gas mixture. Carrier gases like hydrogen, nitrogen, helium and argon can be used.

The sacrificial semiconductor material layers 16 of the semiconductor stack 6 may have a thickness ranging from about 5 nm to about 12 nm, while the semiconductor channel material layers 18 of the semiconductor stack 6 may have a thickness ranging from about 6 nm to about 12 nm. Each sacrificial semiconductor material layer 16 may have a thickness that is the same as, or different from, a thickness of each semiconductor channel material layer 18. In an embodiment, each sacrificial semiconductor material layer 16 has an identical thickness. In an embodiment, each semiconductor channel material layer 18 has an identical thickness.

Figure 2:
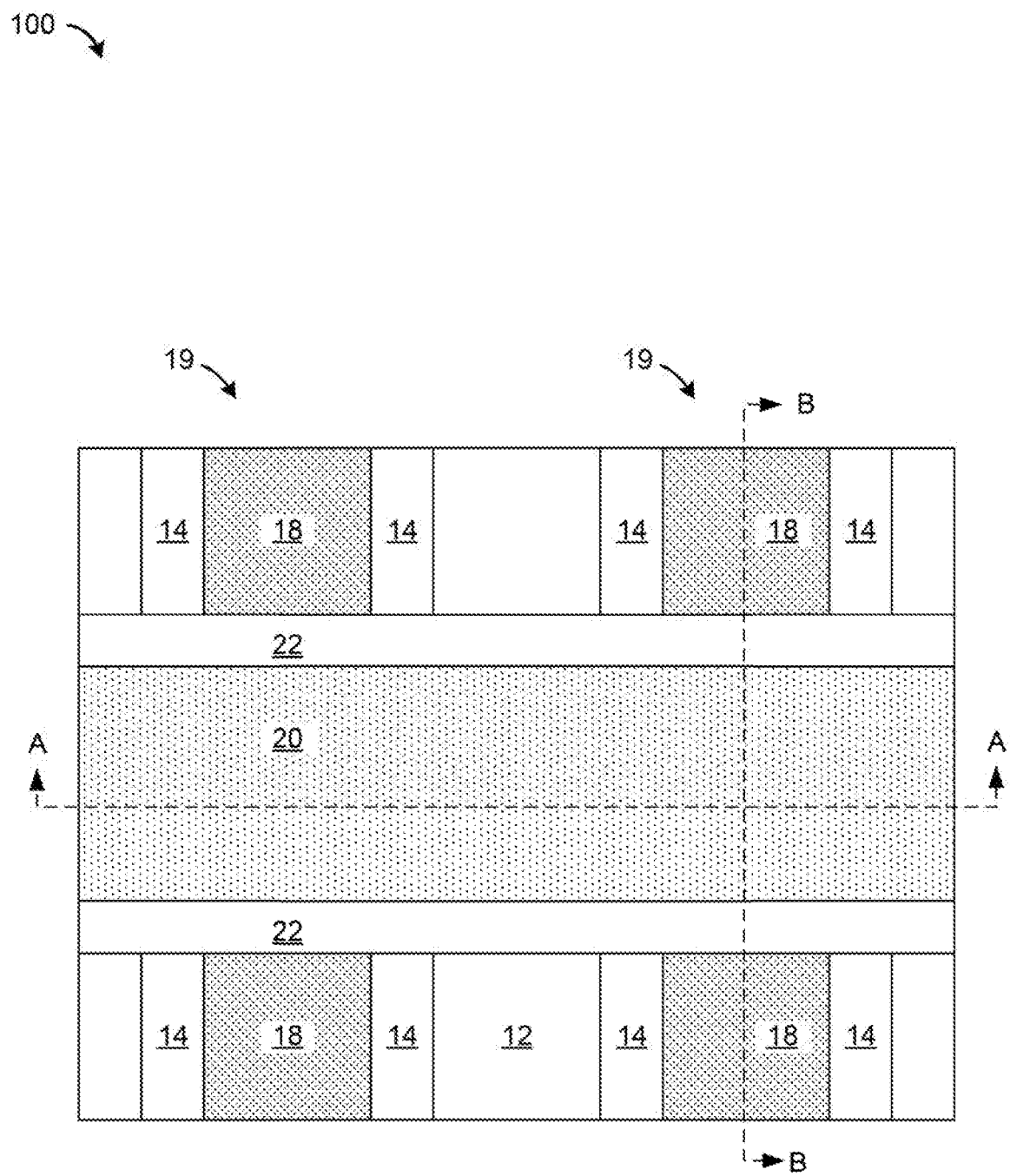
FIG. 2 illustrates a top view of the semiconductor structure at an intermediate stage of fabrication, according to an exemplary embodiment.
Figure 3:
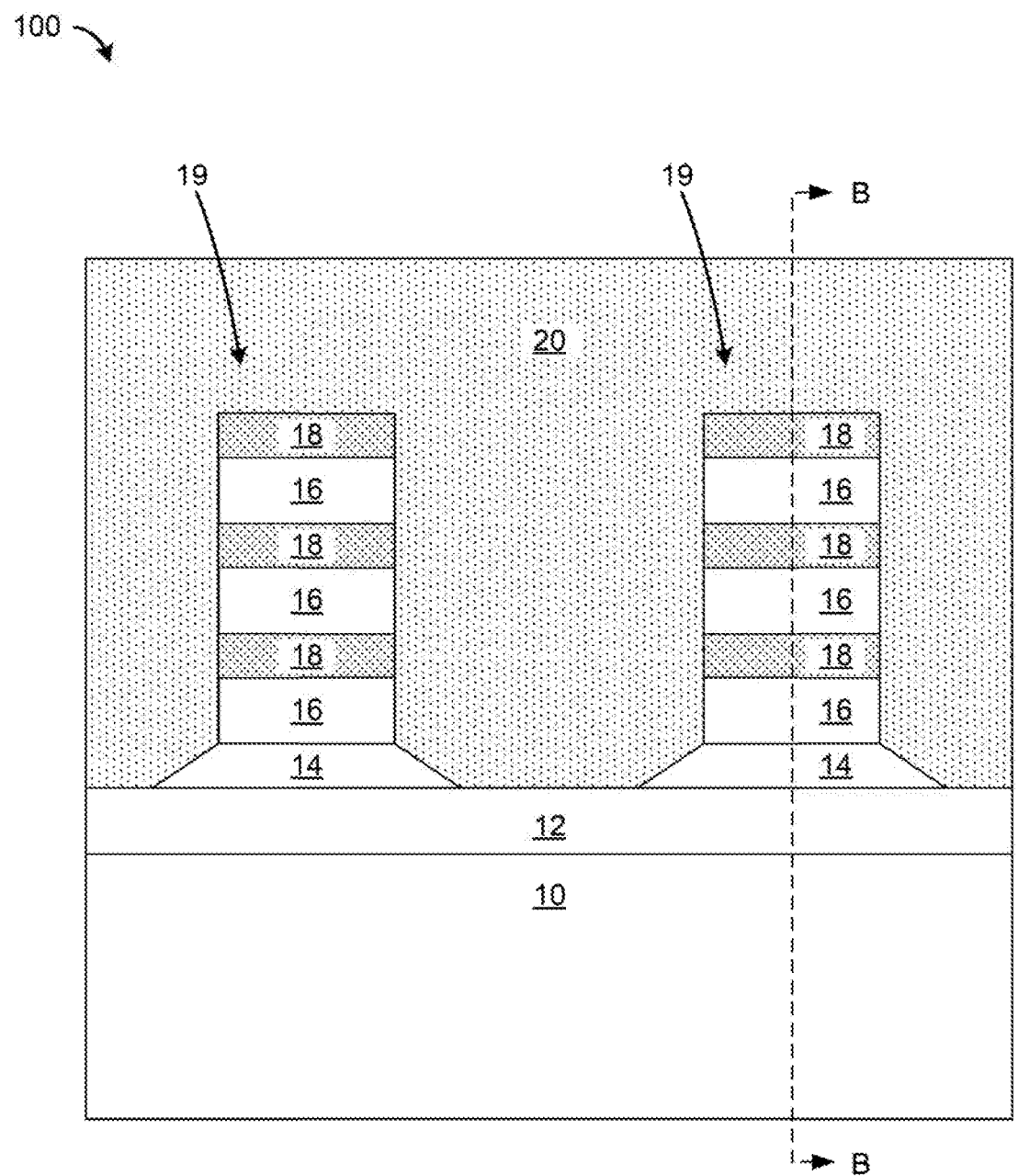
FIGS. 3 and 4 each illustrate a cross-sectional view of the semiconductor structure of FIG. 2 along sections A-A and B-B, respectively, and illustrate forming sacrificial gate structures and dielectric spacers, according to an exemplary embodiment.
Figure 4:
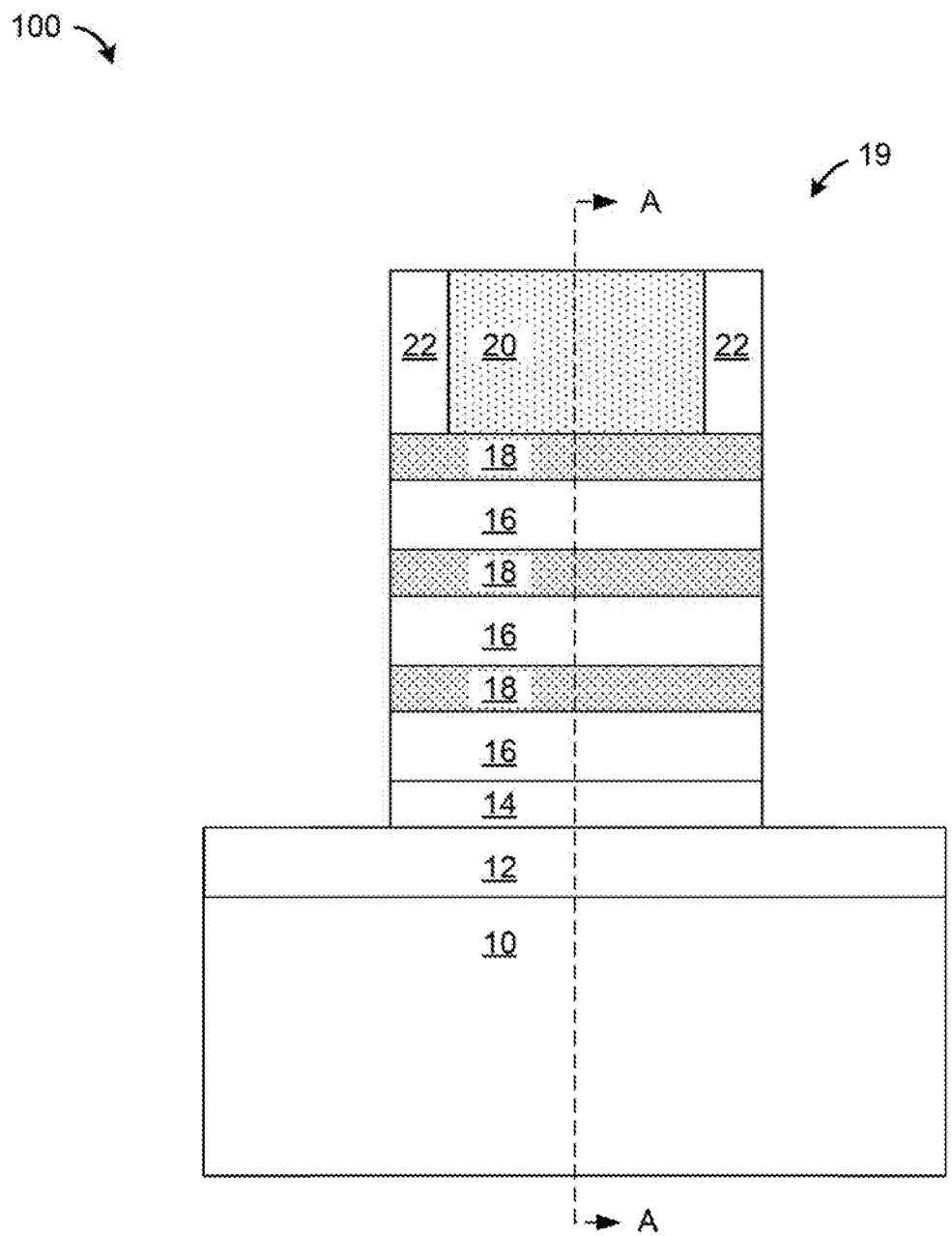

Referring now to FIGS. 2, 3 and 4, the structure 100 is shown according to an exemplary embodiment. FIG. 2 is a top view of the structure 100. FIG. 3 is a cross-sectional view of the structure 100 along section line A-A. FIG. 4 is a cross-sectional view of the structure 100 along section line B-B, and is perpendicular to the cross-sectional view illustrated in FIG. 3.

As shown in FIGS. 2, 3 and 4, nanosheet stacks 19 are formed by patterning the semiconductor stack 6 (16, 18) and the SiGe layer 14. More specifically, portions of the semiconductor stack 6 (16, 18) and the SiGe layer 14 are etched using an anisotropic etching technique, such as, for example, reactive ion etching (ME), and stopping on the insulator layer 12. The nanosheet stacks include alternating nanosheets of remaining portions of each sacrificial semiconductor material layer 16 and each semiconductor channel material layer 18 all on top of a remaining portion of the SiGe layer 14. After etching, sidewalls of each sacrificial semiconductor material layer 16 are vertically aligned to sidewalls of each semiconductor channel material layer 18. (See FIG. 3).

Portions of the SiGe layer 14 are also removed during etching and forming of the nanosheet stacks 19. Unlike the other layers in the nanosheet stacks 19, sidewalls of the SiGe layer 14 are not vertically aligned with the other layers. Instead, etching the SiGe layer 14 produces faceted sidewalls which slope downwards away from the sidewalls of the other layers in the nanosheet stacks 19. When etching reaches the SiGe layer 14 the RIE conditions change and produce the faceted shape. Etching straight down and forming a 90-degree angle using ME is challenging. In general faceting, also call footing, is a problem; however, as disclosed herein, the inventors have discovered new benefits to use the faceted semiconductor extension of the SiGe layer 14 as a lateral etch access point.

As such, as illustrated in FIG. 3 the faceted sidewalls of the SiGe layer 14 laterally extend beyond the sidewalls of the sacrificial semiconductor material layers 16 and the semiconductor channel material layers 18. The faceted ends of the SiGe layer 14 will not have a uniform shape or uniform dimensions due to RIE process variations. For example, the faceted ends of a 30 nm thick SiGe layer 14 may extend laterally from sidewalls of the nanosheet stack approximately 30 nm—approximating a 45-degree facet angle.

Next, a sacrificial gate structure 20 and dielectric spacers 22 are formed orthogonal (perpendicular) to the nanosheet stacks. By way of illustration, one sacrificial gate structure 20 is depicted in the drawings of the present application. The sacrificial gate structure 20 is formed on the semiconductor stack 6 (16,18). The dielectric spacers 22 are present on sidewalls the sacrificial gate structure 20; the dielectric spacers 22.

The sacrificial gate structure 20 may include a single sacrificial material portion or a stack of two or more sacrificial material portions (i.e., at least one sacrificial material portion). The at least one sacrificial material portion can be formed by forming a blanket layer (or layers) of a material (or various materials) and then patterning the material (or various materials) by lithography and an etch. The sacrificial gate structure 20 can include any material including, for example, polysilicon, amorphous silicon, or multilayered combinations thereof. The sacrificial gate structure 20 can be formed using any deposition technique including, for example, atomic layer deposition (ALD), molecular layer deposition (MLD), chemical vapor deposition (CVD), physical vapor deposition (PVD), high density plasma (HDP) deposition, and spin on techniques. Optionally, a sacrificial gate dielectric layer and a gate cap may be formed as part of the sacrificial gate structure 20 in accordance with known techniques.

After forming the sacrificial gate structure 20, the dielectric spacers 22 are formed on exposed surfaces of the sacrificial gate structure 20. The dielectric spacers 22 can be formed by first providing a dielectric spacer material and then etching the dielectric spacer material. For example, the dielectric spacer material may be silicon nitride. In general, the dielectric spacers 22 include any dielectric spacer material, including, for example, a dielectric nitride, dielectric oxide, and/or dielectric oxynitride. More specifically, the dielectric spacers 22 may be, for example, SiBCN, SiBN, SiOCN, SiON, SiCO, or SiC. In an example, the dielectric spacers 22 include a non-conductive low capacitance dielectric material such as SiO$_2$. The dielectric spacers 22 can be formed using any deposition technique including, for example, atomic layer deposition (ALD), molecular layer deposition (MLD), chemical vapor deposition (CVD), physical vapor deposition (PVD), high density plasma (HDP) deposition, and spin on techniques. The etch used to form the dielectric spacers 22 may include a dry etching technique such as, for example, reactive ion etching.

Finally, portions of the nanosheet stacks and portions of the SiGe layer 14 are removed to expose ends of the SiGe layer 14, ends of each sacrificial semiconductor material layers 16, and ends of each semiconductor channel material layer 18. More specifically, portions of the nanosheet stacks 19 and the SiGe layer 14 that are not protected by the sacrificial gate structure 20 and the dielectric spacers 22 are removed using one or more etching techniques in order to accommodate subsequent formation of source drain regions (See FIGS. 5 and 6). For example, exposed portions of the nanosheet stacks 19 can be removed using an anisotropic etching technique, such as, for example, reactive ion etching (RIE), and stopping on the insulator layer 12 of the substrate 8.

After etching, sidewalls of each sacrificial semiconductor material layer 16 are vertically aligned to sidewalls of each semiconductor channel material layer 18, and the vertically aligned sidewalls of the nanosheet stack 19 are vertically aligned to outermost sidewalls of the dielectric spacers 22. (See FIG. 4). Additionally, sidewalls of the SiGe layer 14 are also vertically aligned to sidewalls of each sacrificial semiconductor material layer 16, each semiconductor channel material layer 18, and the outermost sidewalls of the dielectric spacers 22. (See FIG. 4).

Figure 5:
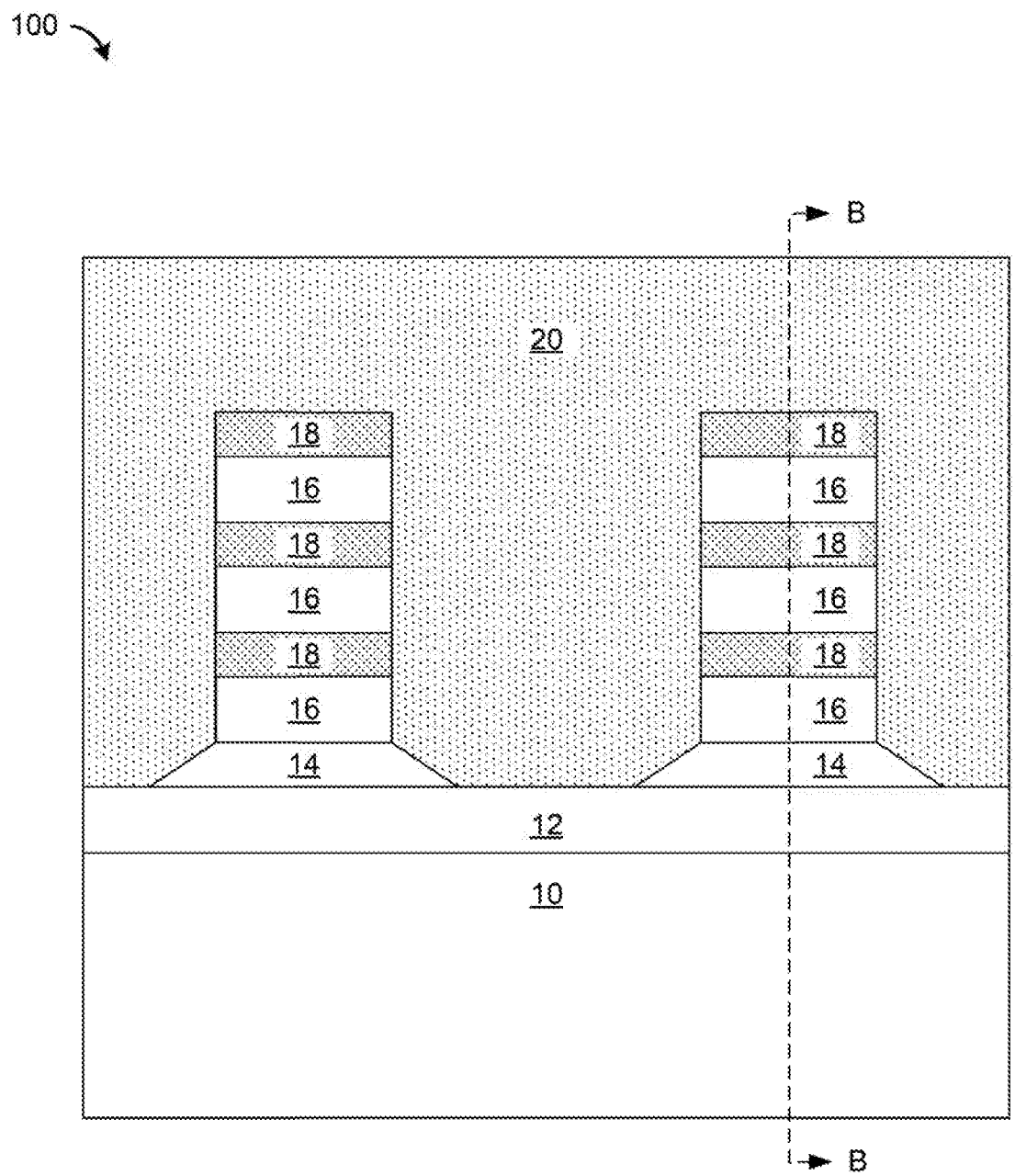
FIGS. 5 and 6 each illustrate a cross-sectional view of the semiconductor structure along sections A-A and B-B, respectively, and illustrate forming a source drain epitaxy, according to an exemplary embodiment.
Figure 6:
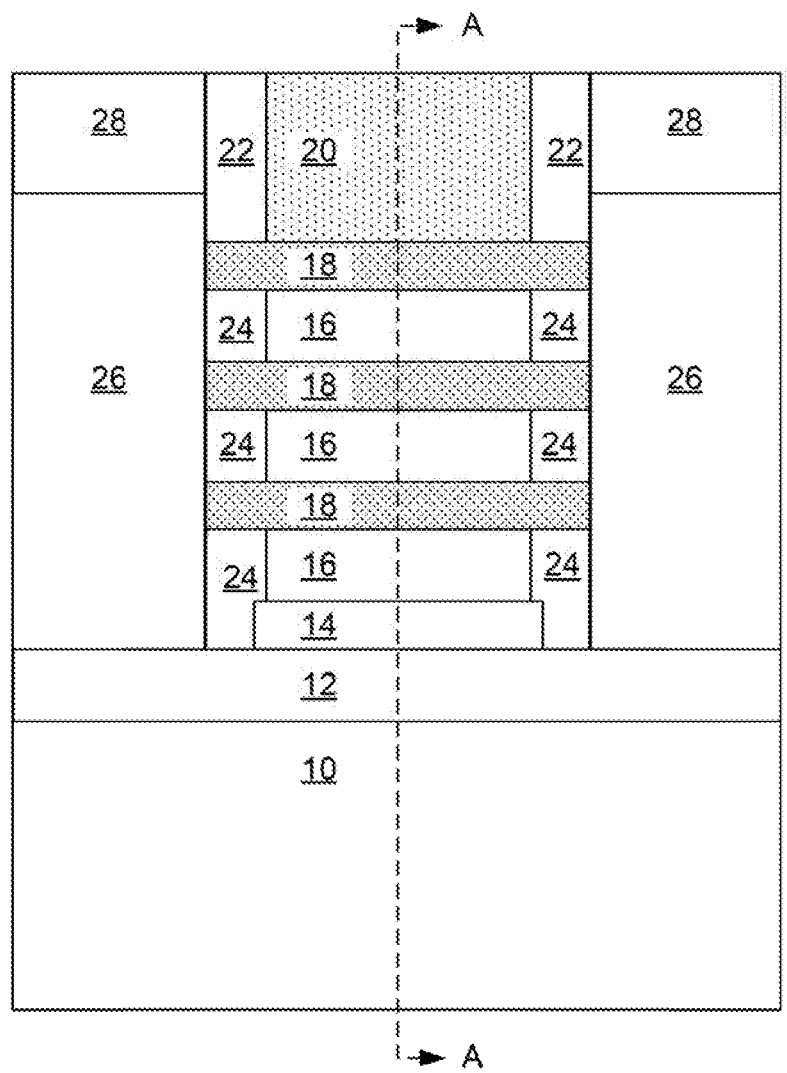

Referring now to FIGS. 5 and 6, the structure 100 is shown according to an exemplary embodiment. FIG. 5 is a cross-sectional view of the structure 100 along section line A-A. FIG. 6 is a cross-sectional view of the structure 100 along section line B-B, and is perpendicular to the cross-sectional view illustrated in FIG. 5.

As shown in FIGS. 5 and 6 the sacrificial semiconductor material layers 16 and the SiGe layer 14 are laterally recessed selective to the semiconductor channel material layers 18. Recessing each sacrificial semiconductor material layer 16 provides a gap or void (not specifically shown) between neighboring semiconductor channel material layers 18 within a given nanosheet stack. Recessing each sacrificial semiconductor material layer 16 may be performed using a lateral etching technique that is selective in removing physically exposed end portions of each sacrificial semiconductor material layer 16 relative to each semiconductor channel material layer 18. For example, a wet etching technique or WETS technique can be used to selectively recess each sacrificial semiconductor material layer 16. Suitable wet etch chemistries include, for example, tetramethylammonium hydroxide (TMAH) solution, potassium hydroxide (KOH) solution, and ethylene diamine and pyrocatechol (EDP) solution. Alternatively, a wet etching technique that relies on a mixture solution of for example HF-HNO3-H2SO4, may be used. After etching, each sacrificial semiconductor material layer 16 has a width less than a width of each semiconductor channel material layer 18.

The SiGe layer 14 is also laterally recessed during etching of the sacrificial semiconductor material layers 16. It should be noted however, that the different material compositions, specifically the different germanium concentrations, will result in the SiGe layer 14 etching slower than the sacrificial semiconductor material layers 16. Therefore, after etching, each sacrificial semiconductor material layer 16 has a width less than the SiGe layer 14.

Next, inner spacers 24 are formed in the voids left by recessing the sacrificial semiconductor material layers 16 and the SiGe layer 14. The inner spacers 24 are formed from a dielectric material that is compositionally the same as the dielectric material of the dielectric spacers 22. In an embodiment, the inner spacers 24 and the dielectric spacers 22 are both composed of silicon nitride. It is noted that the additional dielectric spacer material forms on the physically exposed surfaces of the dielectric spacers 22 and within each gap or void created by recessing of the sacrificial semiconductor material layers 16. The inner spacers 24 can be formed using one of the deposition techniques mentioned above in forming the dielectric spacers 22.

After depositing the inner spacers 24, a directional etch may be used to exposed ends of the semiconductor channel material layers 18. For example, a gas cluster ion beam or RIE etching technique may be used. The ends of the semiconductor channel material layers 18 are exposed to prepare for the subsequent formation of epitaxially grown source drain regions.

Next, source drain regions 26 are formed according to an embodiment. The source drain regions 26 are formed by epitaxial growth of a semiconductor material on physically exposed sidewalls of each semiconductor channel material layer 18. In the present application, the source drain regions 26 grow laterally out from the sidewalls of each semiconductor channel material layer 18.

Each source drain region 26 includes any semiconductor material described above with respect to the substrate 8. In some embodiments, the source drain regions 26 may include the same semiconductor material as that of the semiconductor channel material layers 18. In other embodiments, each source drain region 26 may include a different semiconductor material than that of the semiconductor channel material layers 18. For example, the source drain regions 26 may include a silicon germanium alloy, while the semiconductor channel material layer 18 may comprise silicon.

Each source drain region 26 may further be doped. Acceptable dopants may include either a p-type dopant or an n-type dopant. The term "p-type" refers to the addition of impurities to an intrinsic semiconductor that creates deficiencies of valence electrons. In a silicon-containing semiconductor material, examples of p-type dopants, include, but are not limited to, aluminum, beryllium, boron, cadmium, gallium, germanium, indium, silicon, and zinc. The term "n-type" refers to the addition of impurities that contributes free electrons to an intrinsic semiconductor. In a silicon containing semiconductor material, examples of n-type dopants include, but are not limited to, antimony, arsenic, germanium, phosphorous, selenium, silicon, and tellurium.

In an embodiment, dopants can be introduced into the precursor gas during deposition. In another embodiment, dopants can be introduced into an intrinsic semiconductor layer by using one of ion implantation or gas phase doping. In an embodiment, each source drain regions 26 are made from doped Si:C(P) (for n-type devices) or SiGe:B (for p-type devices), with dopant concentrations ranging from approximately $4 \times 10^{20}$ to approximately $2.5 \times 10^{21}$ atoms/cm2, with a dopant concentration ranging from approximately $8 \times 10^{20}$ to approximately $1.5 \times 10^{21}$ atoms/cm2 being more typical.

As mentioned above, each source drain region 26 is formed by an epitaxial growth (or deposition) technique, as is defined above. Ultimately, the source drain regions 26 will each function as a source or a drain for the nanosheet transistor.

Finally, an interlevel dielectric layer 28 may be formed by conformally depositing or growing a dielectric material, followed by a combination of dry and wet anisotropic etch and recessing steps. The interlevel dielectric layer 28 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the interlevel dielectric layer 28. The use of a self-planarizing dielectric material as the interlevel dielectric layer 28 may avoid the need to perform a subsequent planarizing step.

In an embodiment, the interlevel dielectric layer 28 can be formed using a deposition technique including, for example, chemical vapor deposition (CVD), plasma enhanced chemical vapor deposition (PECVD), evaporation or spin-on coating. In some embodiments, particularly when non-self-planarizing dielectric materials are used as the interlevel dielectric layer 28, a planarization technique or an etch back technique follows the deposition of the interlevel dielectric layer 28. As is shown in the figures, the interlevel dielectric layer 28 may have an upper horizontal surface coplanar with an upper horizontal surface of the dielectric spacers 22.

Figure 7:
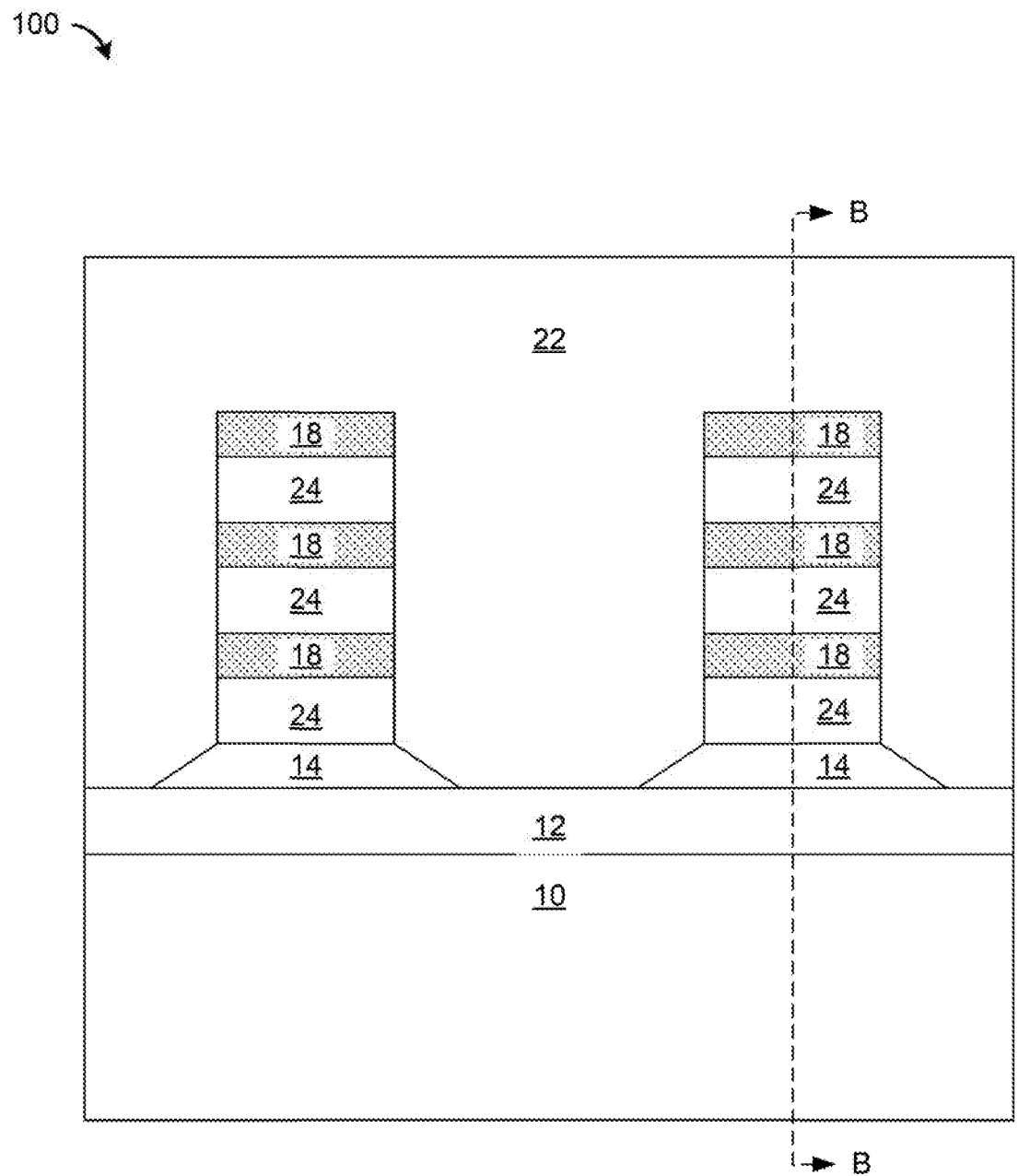
FIGS. 7 and 8 each illustrate a cross-sectional view of the semiconductor structure along sections A-A and B-B, respectively, and illustrate selective removal of the sacrificial gate structures and sacrificial semiconductor material layers, according to an exemplary embodiment.
Figure 8:
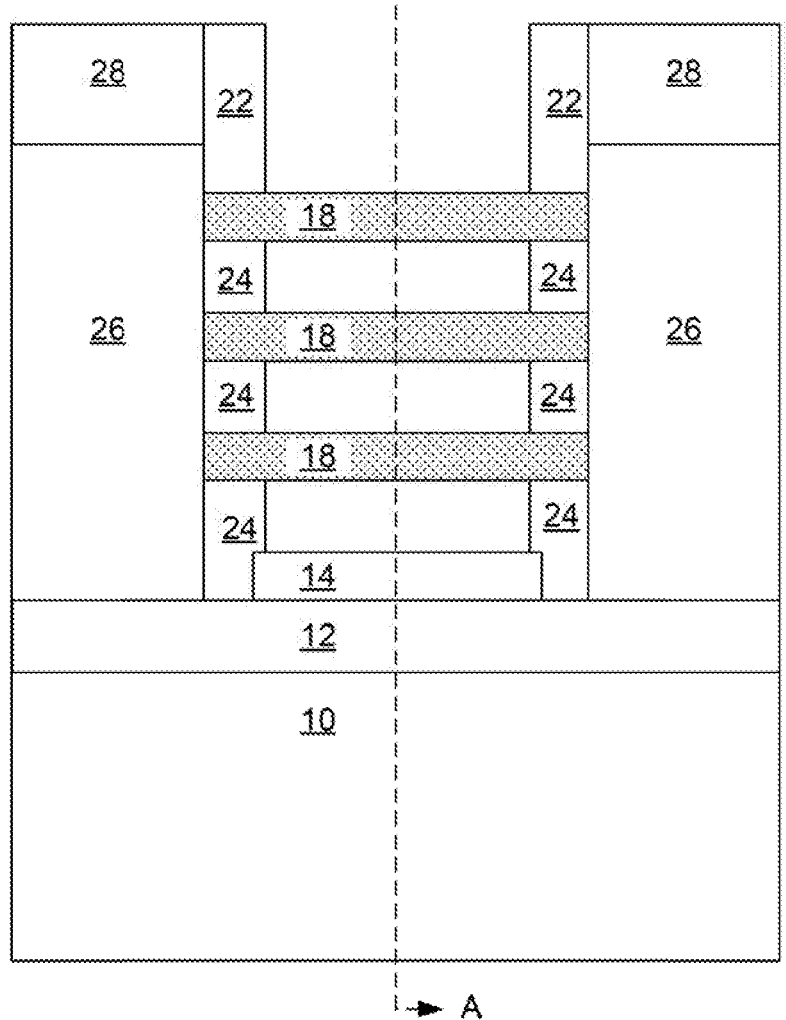

Referring now to FIGS. 7 and 8, the structure 100 is shown according to an exemplary embodiment. FIG. 7 is a cross-sectional view of the structure 100 along section line A-A. FIG. 8 is a cross-sectional view of the structure 100 along section line B-B, and is perpendicular to the cross-sectional view illustrated in FIG. 7.

As shown in FIGS. 7 and 8, the sacrificial gate structure 20 and the sacrificial semiconductor material layers 16 are removed using one or more etching techniques. In doing so, the sacrificial semiconductor material layers 16 are removed selective to the semiconductor channel material layers 18 and the inner spacers 24. As illustrated in FIG. 8, the remaining semiconductor channel material layers 18 are suspended in the middle and supported on both ends by the inner spacers 24.

For example, a wet etching technique or WETS technique can be used to selectively remove the sacrificial semiconductor material layers 16. The wet etching technique may employ special chemical solutions including, for example, tetramethylammonium hydroxide (TMAH) solution, potassium hydroxide (KOH) solution, and ethylene diamine and pyrocatechol (EDP) solution. Alternatively, a wet etching technique that relies on a mixture solution of for example HF-HNO3-H2SO4, may be used.

Figure 9:
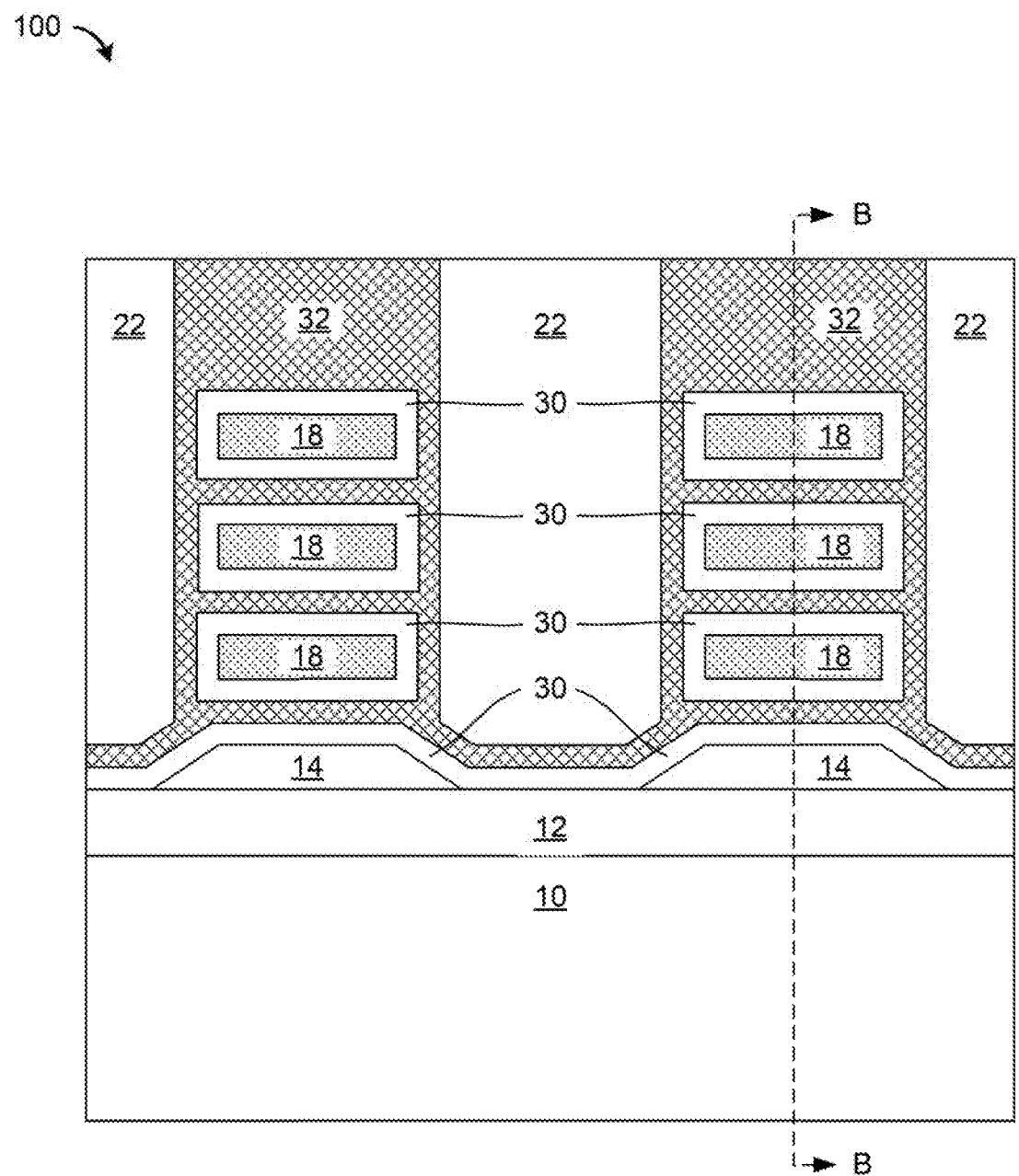
FIGS. 9 and 10 each illustrate a cross-sectional view of the semiconductor structure along sections A-A and B-B, respectively, and illustrate forming a gate dielectric, and a first gate conductor, according to an exemplary embodiment.
Figure 10:
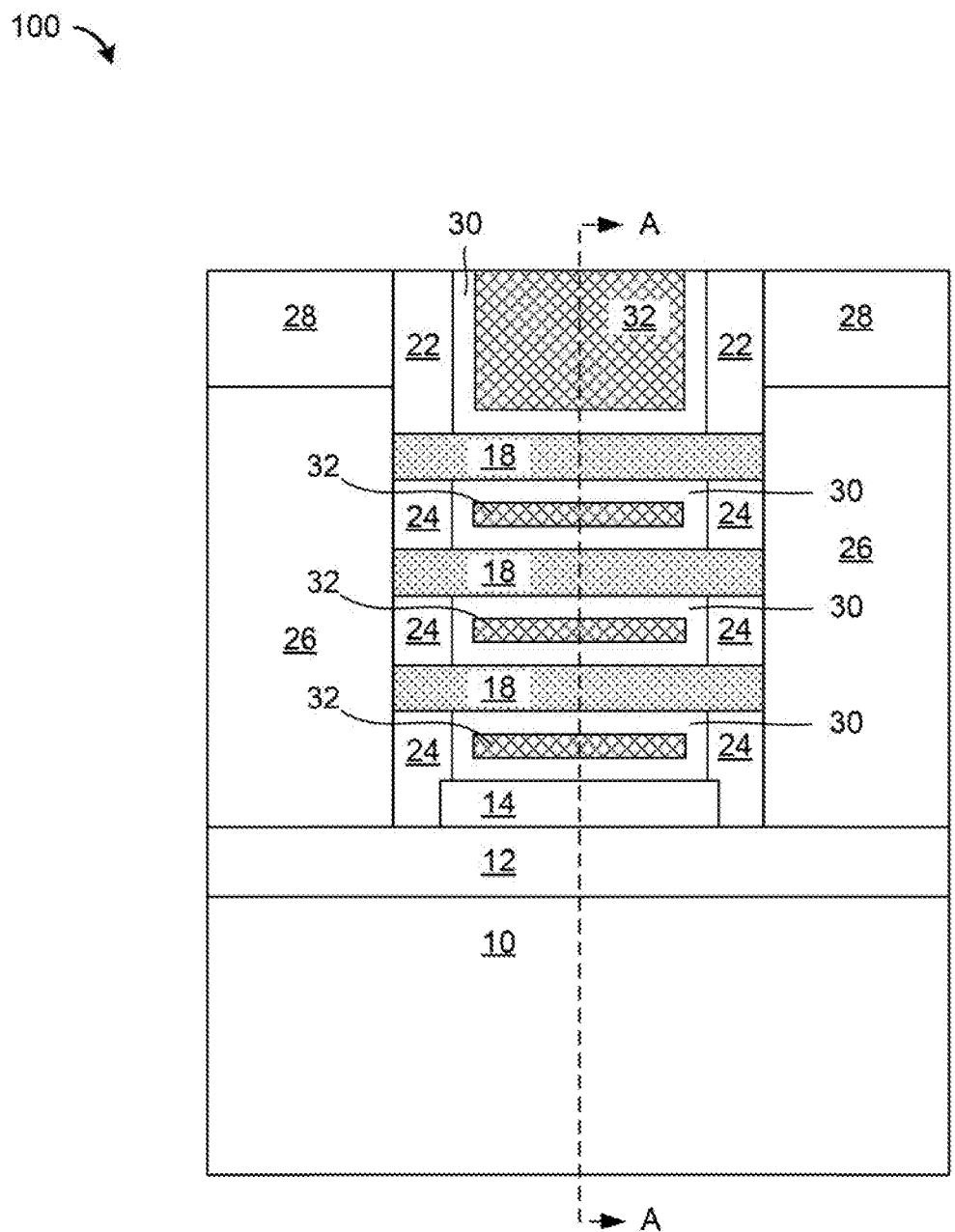

Referring now to FIGS. 9 and 10, the structure 100 is shown according to an exemplary embodiment. FIG. 9 is a cross-sectional view of the structure 100 along section line A-A. FIG. 10 is a cross-sectional view of the structure 100 along section line B-B, and is perpendicular to the cross-sectional view illustrated in FIG. 9.

As shown in FIGS. 9 and 10, a gate dielectric 30, and a first gate conductor 32 are formed in each cavity and surrounding suspended portions of the semiconductor channel material layers 18.

The gate dielectric 30 can be an oxide, nitride, and/or oxynitride. In an example, the gate dielectric 30 can be a high-k material as previously defined. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure including different gate dielectric materials, e.g., silicon dioxide, and a high-k gate dielectric, can be formed and used as the gate dielectric 30.

The gate dielectric 30 can be formed by any deposition technique including, for example, chemical vapor deposition (CVD), plasma enhanced chemical vapor deposition (PECVD), physical vapor deposition (PVD), sputtering, or atomic layer deposition. In an embodiment, the gate dielectric 30 can have a thickness in a ranging from approximately 1 nm to approximately 10 nm. Other thicknesses that are lesser than, or greater than, the aforementioned thickness range can also be employed for the gate dielectric 30.

The first gate conductor 32 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide), or multilayered combinations thereof. In an embodiment, the first gate conductor 32 may include an nFET gate metal. In another embodiment, the first gate conductor 32 may include a pFET gate metal. When multiple gate cavities are formed between layers of the nanosheet stack, it is possible to form a nFET in a first set of the gate cavities and wrapping around some of the semiconductor channel material layers 18 and a pFET in a second set of the gate cavities and wrapping around some of the semiconductor channel material layers 18.

The first gate conductor 32 can be formed by any deposition technique including, for example, chemical vapor deposition (CVD), plasma enhanced chemical vapor deposition (PECVD), physical vapor deposition (PVD), sputtering, atomic layer deposition (ALD) or other like deposition techniques. When a metal silicide is formed, a conventional silicidation technique is used. In an embodiment, the first gate conductor 32 can have a thickness in a ranging from approximately 1 nm to approximately 50 nm, and more preferably ranging from approximately 20 nm to approximately 30 nm. Other thicknesses that are lesser than, or greater than, the aforementioned thickness range can also be employed for the first gate conductor 32. In an embodiment, the thickness of the first gate conductor 32 is deposited with a thickness sufficient to fill, or substantially fill, the spaces between adjacent semiconductor channel material layers 18, and completely surround each of the semiconductor channel material layers 18.

Figure 11:
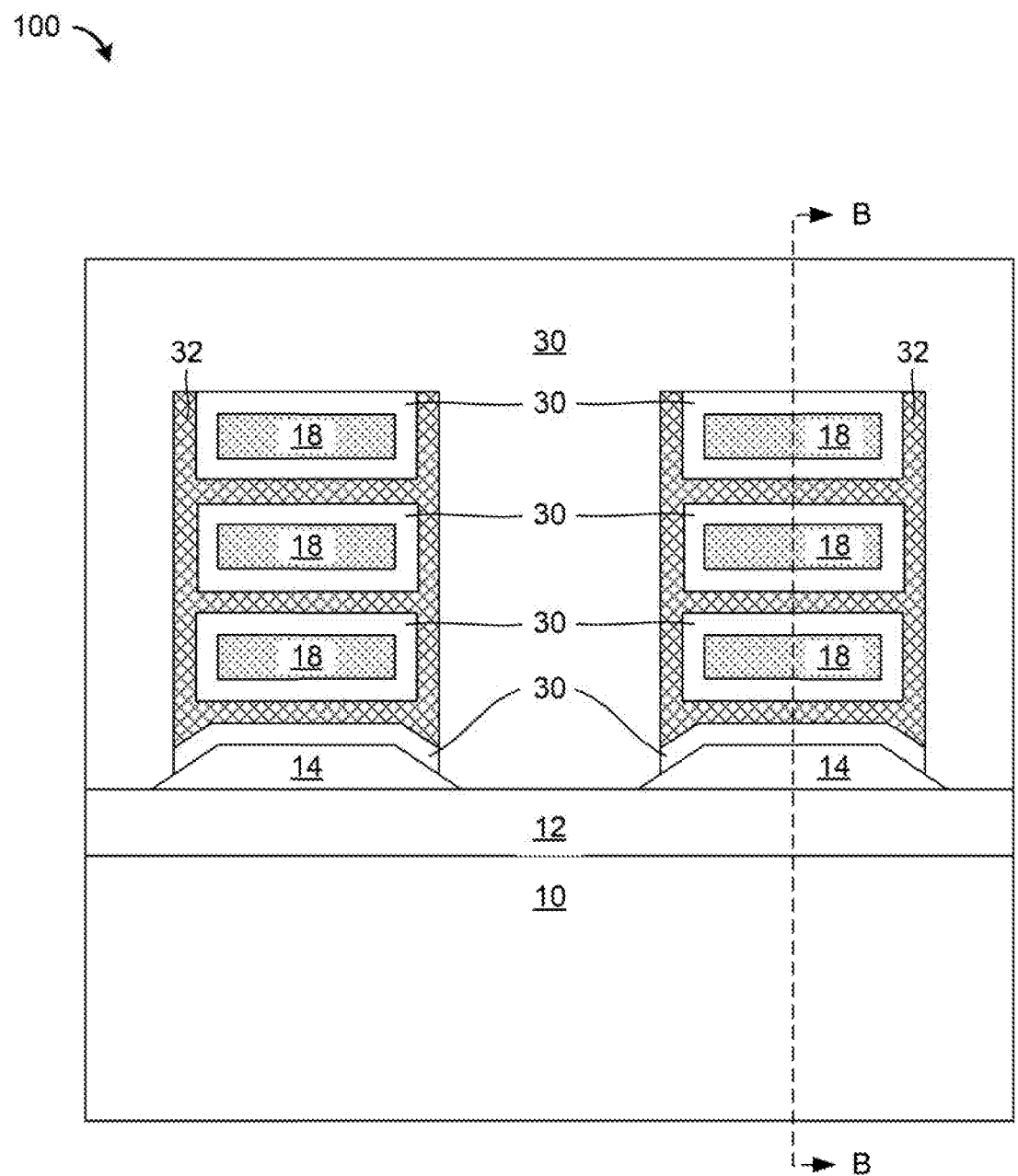
FIGS. 11 and 12 each illustrate a cross-sectional view of the semiconductor structure along sections A-A and B-B, respectively, and illustrate patterning the gate dielectric, and the first gate conductor, according to an exemplary embodiment.
Figure 12:
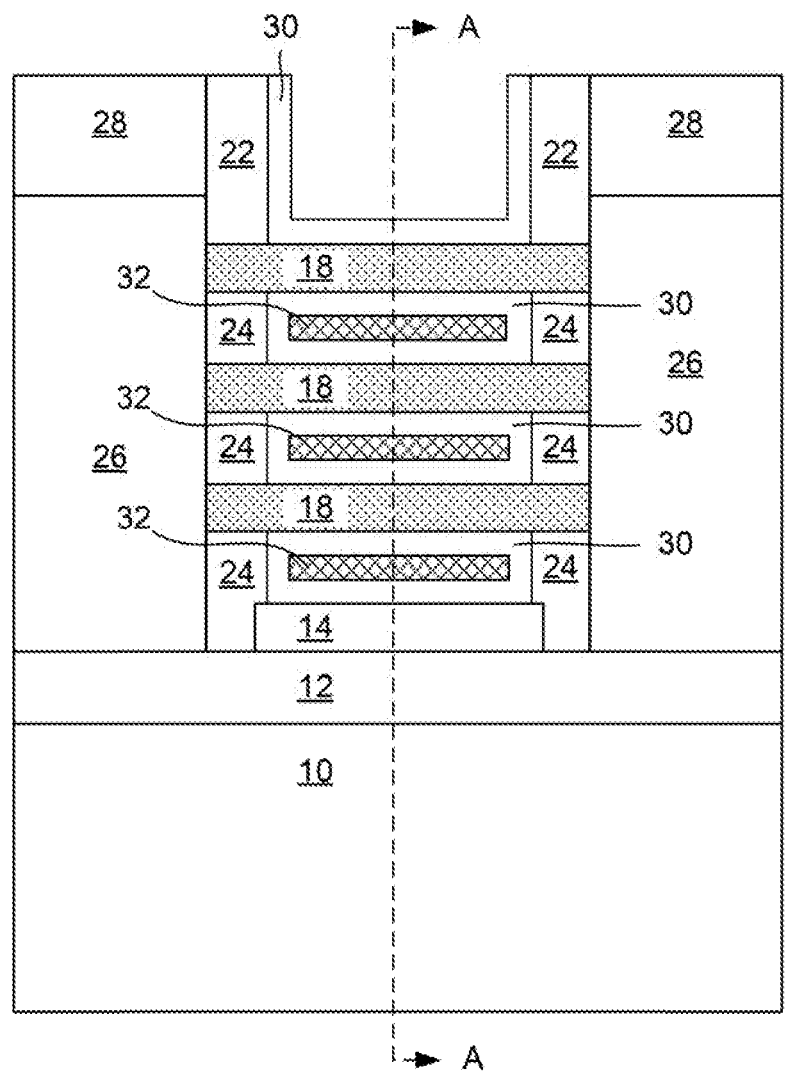

Referring now to FIGS. 11 and 12, the structure 100 is shown according to an exemplary embodiment. FIG. 11 is a cross-sectional view of the structure 100 along section line A-A. FIG. 12 is a cross-sectional view of the structure 100 along section line B-B, and is perpendicular to the cross-sectional view illustrated in FIG. 12.

As shown in FIGS. 11 and 12, the gate dielectric 30 and the first gate conductor 32 are patterned to expose end portions of the SiGe layer 14. The gate dielectric 30 and the first gate conductor 32 are patterned to expose end portions of the SiGe layer 14 may be selectively etched, for example using an anisotropic vertical etch technique such as a reactive ion etch (ME), or any other suitable etch technique. More specifically, portions of the first gate conductor 32 are removed from horizontal surfaces thereby exposing the insulator layer 12 of the substrate 8 and the gate dielectric 30 at the top of the nanosheet stacks. In some cases, sidewalls of the gate dielectric 30 may also be exposed by etching the first gate conductor 32; however, in most cases the first gate conductor 32 will completely cover the sidewalls of the gate dielectric 30.

After etching, end portions of the SiGe layer 14 are exposed. The SiGe layer 14 must be thick enough to ensure the faceted ends can be exposed when patterning the gate dielectric 30 and the first gate conductor 32. As such, a thicker SiGe layer 14 may produce a larger faceted end and allow for more process variation when patterning the gate dielectric 30 and the first gate conductor 32. For example, the faceted ends of a 30 nm thick SiGe layer 14 may extend laterally from sidewalls of the nanosheet stack approximately 30 nm, and the first gate conductor 32 is laterally recessed approximately 15 nm to expose the faceted ends of the SiGe layer 14.

Figure 13:
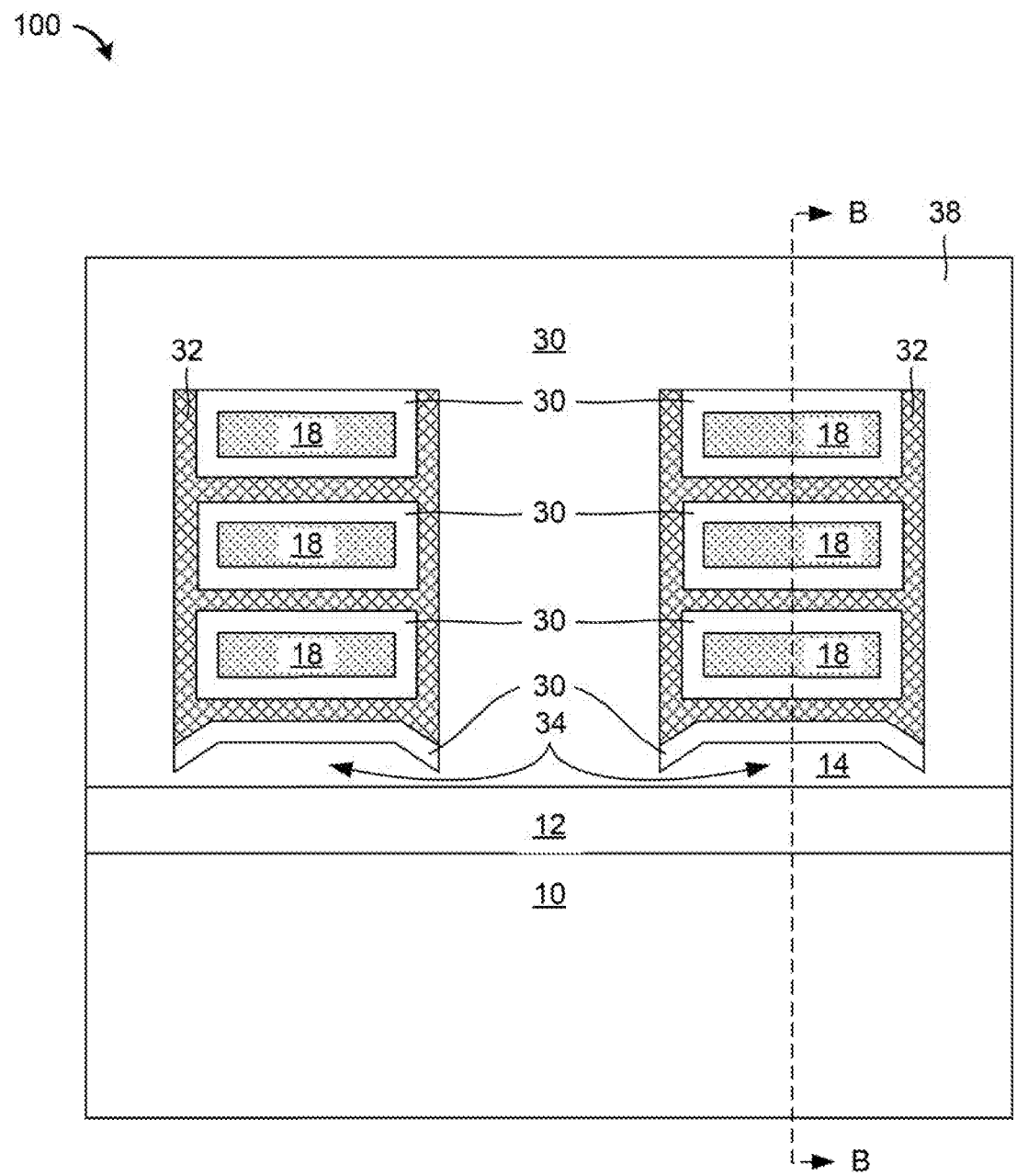
FIGS. 13 and 14 each illustrate a cross-sectional view of the semiconductor structure along sections A-A and B-B, respectively, and illustrate selectively removing a silicon germanium layer, according to an exemplary embodiment.
Figure 14:
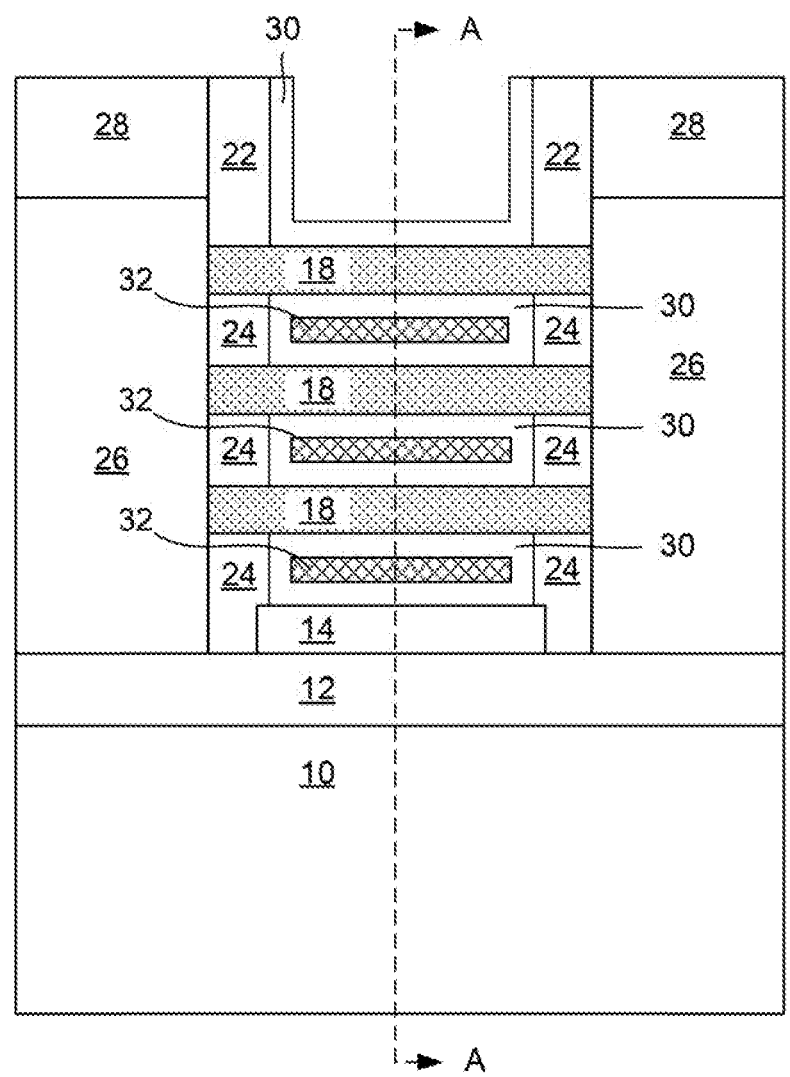

Referring now to FIGS. 13 and 14, the structure 100 is shown according to an exemplary embodiment. FIG. 13 is a cross-sectional view of the structure 100 along section line A-A. FIG. 14 is a cross-sectional view of the structure 100 along section line B-B, and is perpendicular to the cross-sectional view illustrated in FIG. 13.

As shown in FIGS. 13 and 14, the SiGe layer 14 may be selectively removed in its entirety. Etching techniques similar to those described above with respect to laterally recessing the sacrificial semiconductor material layers 16 may be used to remove the SiGe layer 14. For example, a wet etching technique or WETS technique can be used to selectively remove the SiGe layer 14. Suitable wet etch chemistries include, for example, tetramethylammonium hydroxide (TMAH) solution, potassium hydroxide (KOH) solution, and ethylene diamine and pyrocatechol (EDP) solution. Alternatively, a wet etching technique that relies on a mixture solution of for example HF-HNO3-H2SO4, may be used. After removing the SiGe layer 14 a gap 34 remains beneath the nanosheet stack and above the insulator layer 12 of the substrate 8.

Figure 15:
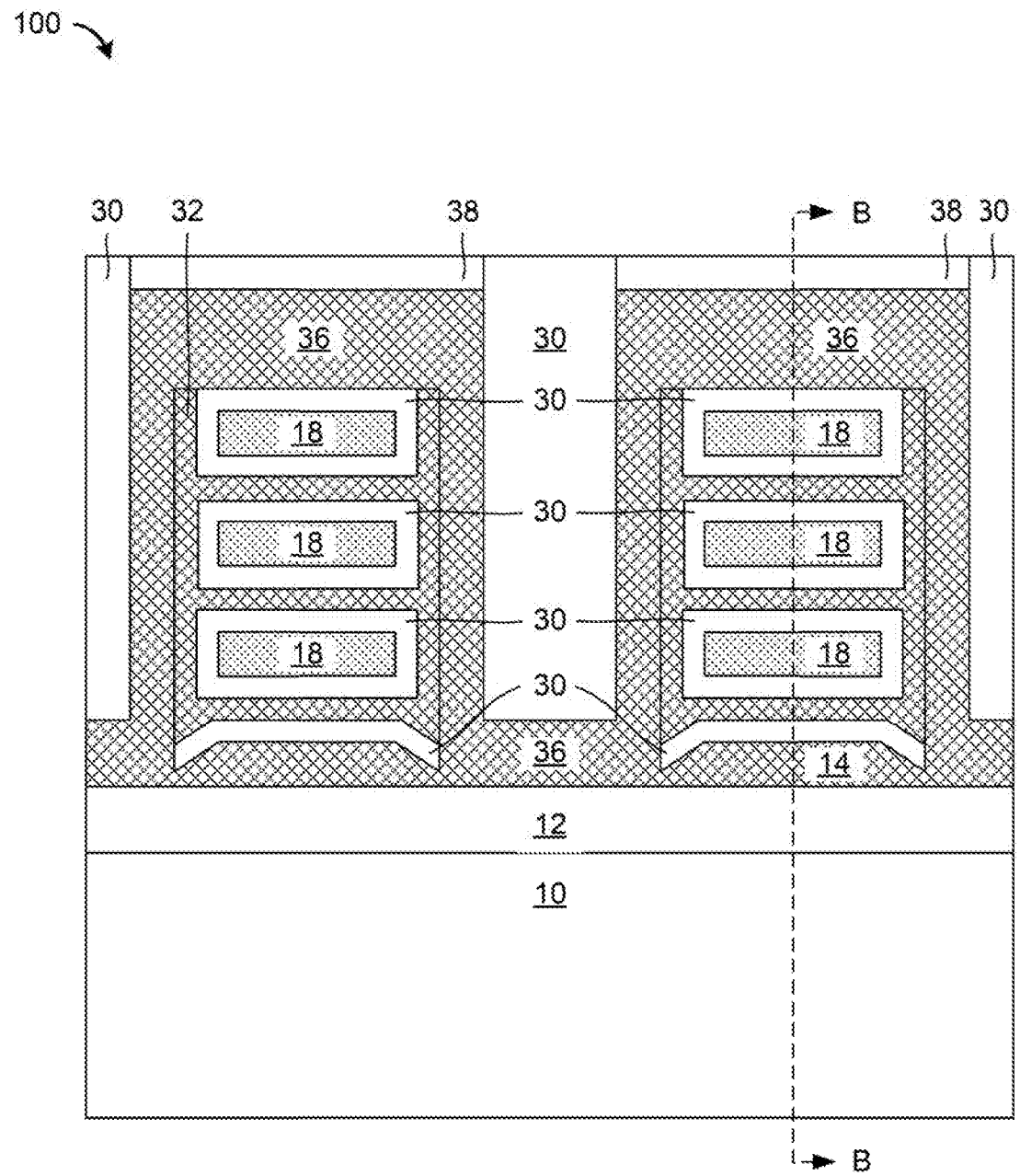
FIGS. 15 and 16 each illustrate a cross-sectional view of the semiconductor structure along sections A-A and B-B, respectively, and illustrate forming a second gate conductor, according to an exemplary embodiment.
Figure 16:
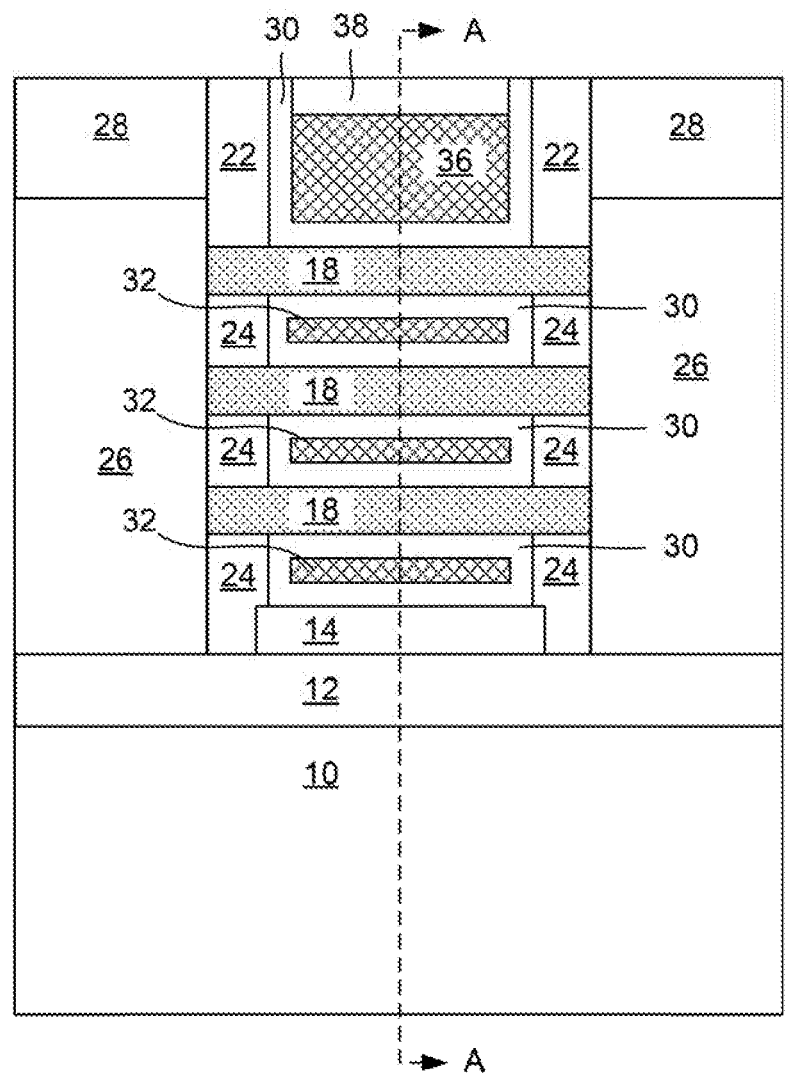

Referring now to FIGS. 15 and 16, the structure 100 is shown according to an exemplary embodiment. FIG. 15 is a cross-sectional view of the structure 100 along section line A-A. FIG. 16 is a cross-sectional view of the structure 100 along section line B-B, and is perpendicular to the cross-sectional view illustrated in FIG. 15.

As shown in FIGS. 15 and 16, a second gate conductor 36 is formed on top of the first gate conductor 32, and within the gap 34 created by the removal of the SiGe layer 14. The second gate conductor 36 can be made from similar materials using similar techniques as described above with respect to the first gate conductor 32. In an embodiment, the second gate conductor 36 can have a thickness in a ranging from approximately 1 nm to approximately 50 nm. More preferably, the second gate conductor 36 should have a thickness at least as thick as the SiGe layer 14. Most preferably, the second gate conductor 36 should have a thickness sufficient to ensure second gate conductor 36 completely fills the gap 34. Other thicknesses that are lesser than, or greater than, the aforementioned thickness range can also be employed for the second gate conductor 36.

Regardless of the chosen materials the first gate conductor 32 and the second gate conductor 36 together form a cohesive gate conductor for the nanosheet transistor. The first gate conductor 32 and the second gate conductor 36 are depicted as separate layers for illustrative purposes only.

After forming the second gate conductor 36, a self-aligned cap 38 is formed on top of the combined gate conductor (32, 36). The self-aligned cap 38 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. In some embodiments, a self-planarizing material such as a spin-on glass (SOG) or a spin-on low-k dielectric material such as SiLK™ can be used as the self-aligned cap 38. The use of a self-planarizing dielectric material as the self-aligned cap 38 may avoid the need to perform a subsequent planarizing step.

First, the combined gate conductor (32, 36) is recessed slightly, and the self-aligned cap 38 may be selectively deposited on upper surfaces of the combined gate conductor (32, 36) within the recess. In an embodiment, the self-aligned cap 38 can be formed using any deposition technique including, for example, chemical vapor deposition (CVD), plasma enhanced chemical vapor deposition (PECVD), evaporation or spin-on coating. In some embodiments, particularly when non-self-planarizing dielectric materials are used as the self-aligned cap 38, a planarization technique or an etch back technique follows the deposition of the self-aligned cap 38. As is shown in the figures, the self-aligned cap 38 may have an upper horizontal surface coplanar with an upper horizontal surface of the dielectric spacers 22.

Figure 17:
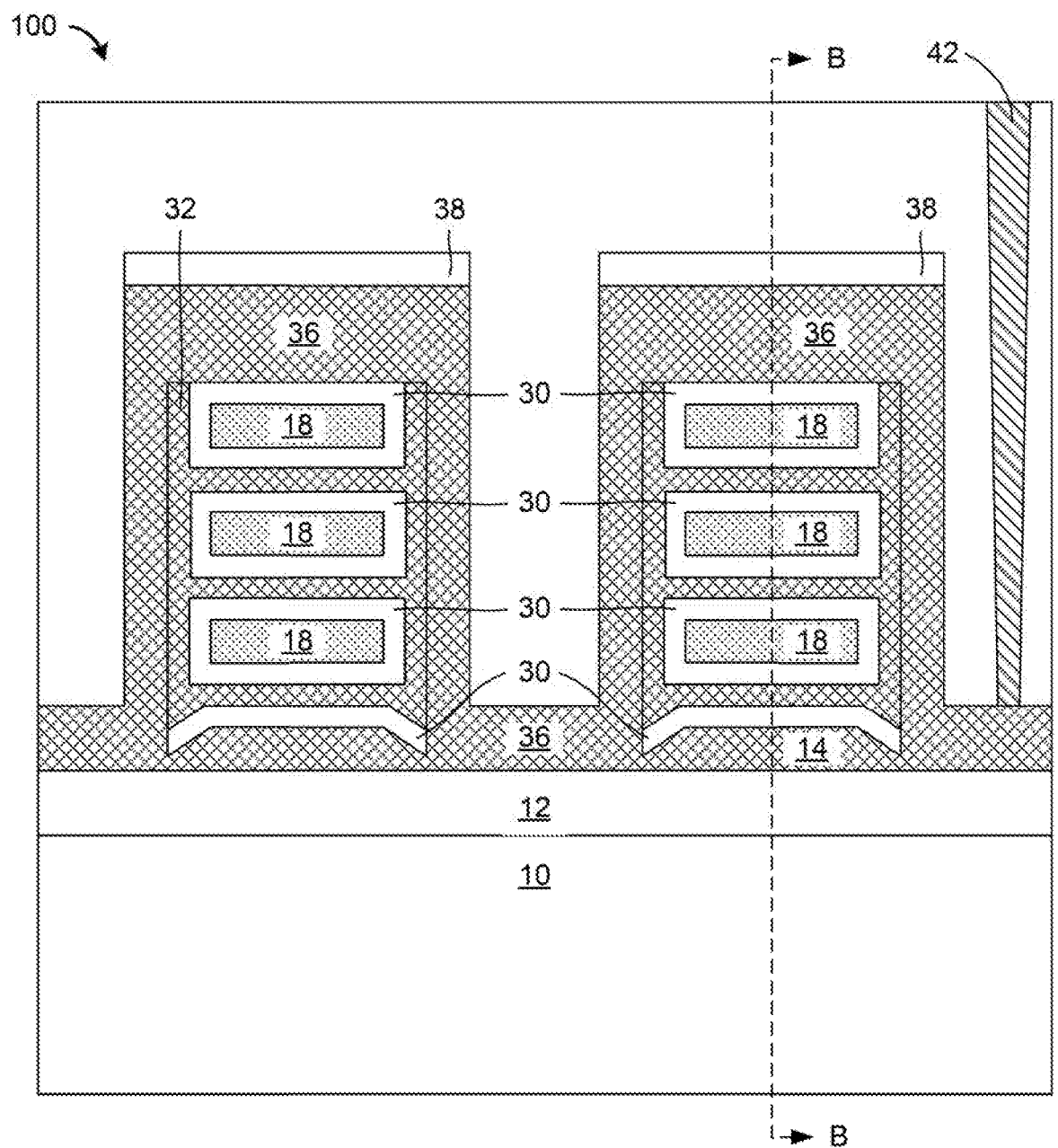
FIGS. 17 and 18 each illustrate a cross-sectional view of the semiconductor structure along sections A-A and B-B, respectively, and illustrate forming contacts, according to an exemplary embodiment.
Figure 18:
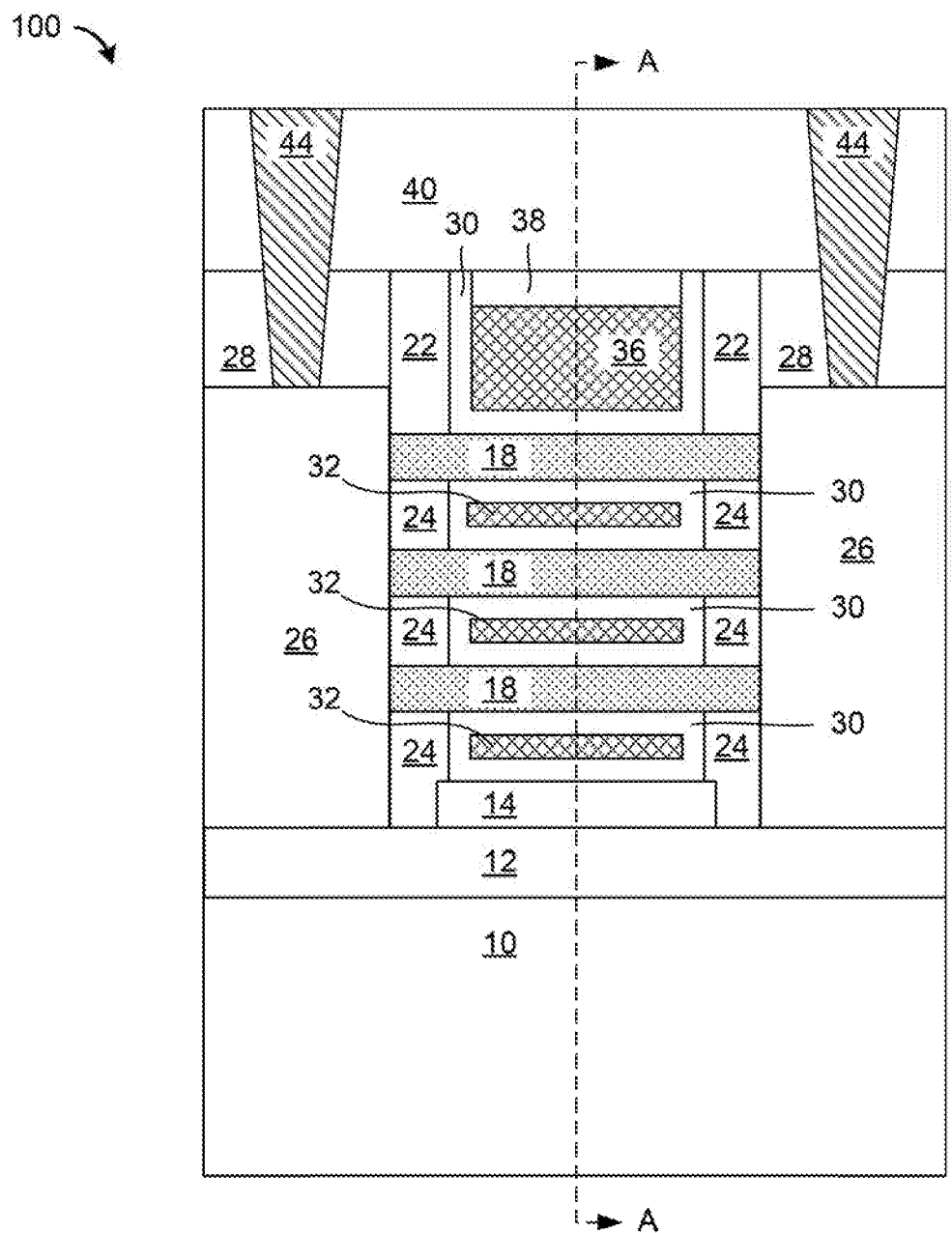

Referring now to FIGS. 17 and 18, the structure 100 is shown according to an exemplary embodiment. FIG. 17 is a cross-sectional view of the structure 100 along section line A-A. FIG. 18 is a cross-sectional view of the structure 100 along section line B-B, and is perpendicular to the cross-sectional view illustrated in FIG. 17.

As shown in FIGS. 17 and 18, a second interlevel dielectric layer 40 may be formed, followed by the forming of a gate contact 42 and source drain contacts 44. The second interlevel dielectric layer 40 can be made from similar materials using similar techniques as described above with respect to the first interlevel dielectric layer 28. Next contact structures, for example, the gate contact 42 and the source drain contact 44 are formed according to known techniques.

As illustrated in FIGS. 17 and 18, the nanosheet transistor device represented by the structure 100 in this example has some distinctive notable features. For instance, the structure 100 includes a buried gate contact (42). Unlike similar devices, rather than landing the gate contact on top of the gate above the nanosheet stack, the buried gate contact disclosed herein lands on the gate conductor adjacent to the nanosheet stack. Doing so reduces final height or thickness of the second interlevel dielectric layer 40 thereby reducing the volume of contact material and providing more space between contacts. Further parasitic resistance is reduced due to the smaller volume of contact material and additional space between contacts (42, 44).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a nanosheet stack on a silicon germanium on insulator substrate, the nanosheet stack comprising alternating layers of a sacrificial semiconductor material and a semiconductor channel material vertically aligned and stacked one on top of another;
   removing the silicon germanium layer of the silicon germanium on insulator substrate to create a void directly beneath the nanosheet stack;
   forming a gate conductor layer within the void directly beneath the nanosheet stack, wherein the gate conductor separates the nanosheet stack from an insulating layer of the silicon germanium on insulator substrate; and
   forming a gate contact on the gate conductor layer adjacent to the nanosheet stack.

2. The method according to claim 1, wherein the silicon germanium layer of the silicon germanium on insulator substrate comprises less than 20 percent germanium.

3. The method according to claim 1, wherein the sacrificial semiconductor material layers are silicon germanium, and the germanium concentration of the silicon germanium layer of the silicon germanium on insulator substrate is less than the germanium concentration of the sacrificial semiconductor material layers.

4. The method according to claim 1, wherein a height of the gate contact is larger than a height of the nanosheet stack.

5. The method according to claim 1, wherein the gate conductor extends beneath the nanosheet stack, and separates the nanosheet stack from an insulating layer of the silicon germanium on insulator substrate.

6. The method according to claim 1, further comprising:
   forming source drain regions extending laterally from end of the semiconductor channel material layers of the nanosheet stack.

7. A method comprising:
   forming a nanosheet stack on a silicon germanium on insulator substrate, the nanosheet stack comprising alternating layers of a sacrificial semiconductor material and a semiconductor channel material vertically aligned and stacked one on top of another;
   forming a first gate conductor layer orthogonal to the nanosheet stack, the first gate conductor wraps around the semiconductor channel material layers of the nanosheet stack;
   patterning the first gate conductor to expose end portions of the silicon germanium layer of the silicon germanium on insulator substrate;
   removing the silicon germanium layer of the silicon germanium on insulator substrate to create a void directly beneath the nanosheet stack;
   forming a second gate conductor layer on top of the first gate conductor and within the void directly beneath the nanosheet stack; and
   forming a gate contact on the second gate conductor layer adjacent to the nanosheet stack.

8. The method according to claim 7, wherein the silicon germanium layer of the silicon germanium on insulator substrate comprises less than 20 percent germanium.

9. The method according to claim 7, wherein the sacrificial semiconductor material layers are silicon germanium, and the germanium concentration of the silicon germanium layer of the silicon germanium on insulator substrate is less than the germanium concentration of the sacrificial semiconductor material layers.

10. The method according to claim 7, wherein a height of the gate contact is larger than a height of the nanosheet stack.

11. The method according to claim 7, wherein the gate conductor extends beneath the nanosheet stack, and separates the nanosheet stack from an insulating layer of the silicon germanium on insulator substrate.

12. The method according to claim 7, further comprising:
    forming source drain regions extending laterally from end of the semiconductor channel material layers of the nanosheet stack.

13. A semiconductor structure comprising:
    a nanosheet stack on a silicon germanium on insulator substrate, the nanosheet stack comprising alternating layers of a sacrificial semiconductor material and a semiconductor channel material vertically aligned and stacked one on top of another;
    a gate conductor orthogonal to the nanosheet stack and wrapping around the semiconductor channel material layers of the nanosheet stack; and
    a gate contact on the gate conductor adjacent to the nanosheet stack.

14. The semiconductor structure according to claim 13, wherein the silicon germanium layer of the silicon germanium on insulator substrate comprises less than 20 percent germanium.

15. The semiconductor structure according to claim 13, wherein the sacrificial semiconductor material layers are silicon germanium, and the germanium concentration of the silicon germanium layer of the silicon germanium on insulator substrate is less than the germanium concentration of the sacrificial semiconductor material layers.

16. The semiconductor structure according to claim 13, wherein a height of the gate contact is larger than a height of the nanosheet stack.

17. The semiconductor structure according to claim 13, wherein the gate conductor extends beneath the nanosheet stack, and separates the nanosheet stack from an insulating layer of the silicon germanium on insulator substrate.

18. The semiconductor structure according to claim 13, further comprising:
    source drain regions extending laterally from end of the semiconductor channel material layers of the nanosheet stack.

19. The semiconductor structure according to claim 13, further comprising:
a gate dielectric layer separating the gate conductor from the semiconductor channel material layers of the nanosheet stack, wherein a portion of the gate dielectric layer.

* * * * *